United States Patent
Noh

(10) Patent No.: US 6,549,994 B1
(45) Date of Patent: Apr. 15, 2003

(54) SEMICONDUCTOR MEMORY DEVICE CAPABLE OF PERFORMING A WRITE OPERATION 1 OR 2 CYCLES AFTER RECEIVING A WRITE COMMAND WITHOUT A DEAD CYCLE

(75) Inventor: Yong-Hwan Noh, Yongin (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/346,286

(22) Filed: Jul. 1, 1999

(30) Foreign Application Priority Data

Jul. 7, 1998 (KR) .............................................. 98-27343

(51) Int. Cl.[7] .............................................. G06F 12/00
(52) U.S. Cl. ........................................ 711/169; 711/168
(58) Field of Search ................................ 711/167, 168, 711/169

(56) References Cited

U.S. PATENT DOCUMENTS 5,706,469 A * 1/1998 Kobayashi .................. 710/240
5,768,559 A * 6/1998 Iino et al. .................... 711/157

* cited by examiner

Primary Examiner—Matthew Kim
Assistant Examiner—Matthew D. Anderson
(74) Attorney, Agent, or Firm—Marger Johnson & McCollom P.C.

(57) ABSTRACT

The present invention relates to a semiconductor memory device capable of performing a write operation 1 or 2 cycles after receiving a write command without necessitating a dead cycle. The elimination of the dead cycle between read and write operations improves bus efficiency and thus, speed. The memory device of the present invention includes an address input control means for receiving an external write or read address and delaying the write address by either 1 or 2 cycles. A data input control means receives external write data and delays the write data by a first or second predetermined number of cycles according to the write mode. A data transmission control means transmits the delayed write data responsive to a predetermined set of input commands. The data input control means reads the data from a cell corresponding to the read address, provides the write data to a cell corresponding to the write address, and writes the transmitted delayed data into the cell corresponding to the write address.

31 Claims, 6 Drawing Sheets

SEMICONDUCTOR MEMORY DEVICE CAPABLE OF PERFORMING A WRITE OPERATION 1 OR 2 CYCLES AFTER RECEIVING A WRITE COMMAND WITHOUT A DEAD CYCLE

BACKGROUND OF THE INVENTION

1. Field of the Invention

The present invention relates to a semiconductor memory device and, more particularly, to a semiconductor memory device that can perform a write operation 1 cycle or 2 cycles after receiving a write command without a dead cycle.

2. Description of the Prior Art

A semiconductor memory device provided with a conventional write function after 1 cycle or 2 cycles is provided with a write address during the execution of a write command. After receiving the write command and before executing the write operation, the memory device is also provided with external write data after delaying 1 or 2 cycles measured from the time of the previously provided write address.

The semiconductor memory device having such a conventional write function requires a dead cycle when changing from a read operation to a write operation and vice versa. A dead cycle requires a no operation (NOP) state that detrimentally affects bus efficiency. Accordingly, a need remains for a semiconductor memory device that can perform the write operation after 1 or 2 cycles without the need for a dead cycle.

SUMMARY OF THE INVENTION

An object of the present invention is to overcome the problems associated with prior art semiconductor memory devices.

A further object of the present invention is to provide a semiconductor memory device for executing a write function after 1 or 2 cycles without necessitating a dead cycle.

To achieve the above-described objects, a semiconductor memory device is provided. The memory device comprises address input control means for receiving an external write or read address and delaying the write address by 1 cycle when the memory device operates in a write after 1 cycle mode or by 2 cycles when the memory device operates in a write after 2 cycles mode. A data input control means receives external write data and delaying the write data by a first predetermined number of cycles when the memory device operates in the write after 1 cycle mode or delaying the write data by a second predetermined number of cycles when the memory device operates in the write after 2 cycles mode. A data transmission control means transmits the delayed write data responsive to a predetermined set of input commands. The data input control means reads the data from a cell corresponding to the read address, provides the write data to a cell corresponding to the write address using a flow through method in the write after 1 cycle mode and using a pipeline method in the write after 2 cycles mode, and writes the transmitted delayed data into the cell corresponding to the write address. The first predetermined number of cycles is either 0 or 1 and the second predetermined number of cycles are 0, 1, or 2. The data transmission control means transmits write data delayed by 0 cycles when a write, write command sequence is received in the write after 1 cycle mode, transmits write data delayed by 1 cycle when a read, write command sequence is received in the write after 1 cycle mode, transmits write data delayed by 0 cycles when a write, write, write command sequence is received in the write after 2 cycles mode, transmits write data delayed by 1 cycle when either a write, read, write or a read, write, write command sequence is received in the write after 2 cycles mode, and transmits write data delayed by 2 cycles when a read, read, write command sequence is received in the write after 2 cycles mode.

BRIEF DESCRIPTION OF THE DRAWINGS

The foregoing and other objects, features, and advantages of the invention will become more readily apparent from the following detailed description of a preferred embodiment that proceeds with reference to the following drawings.

DETAILED DESCRIPTION OF THE PREFERRED EMBODIMENTS

Figure 1:
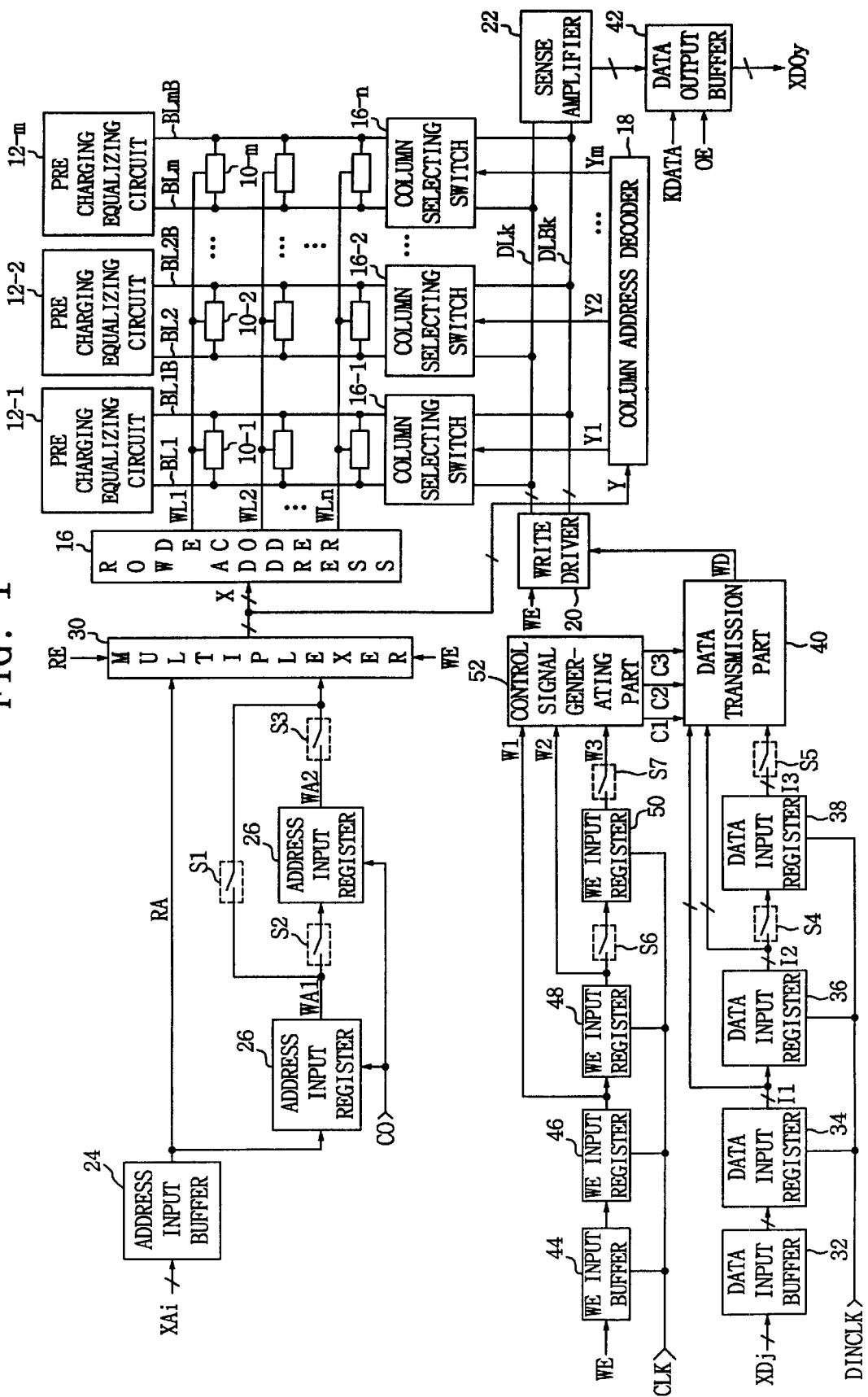
FIG. 1 is a block diagram of a semiconductor memory device according to the present invention.

FIG. 1 is a block diagram of the semiconductor memory device according to the present invention. The semiconductor memory device is comprised of m×n number of memory cells, e.g., 10-1, 10-2, ..., 10-m, precharging and equalizing circuits 12-1, 12-2, ..., 12-m, column selection switches 14-1, 14-2, ..., 14-m, a row address decoder 16, a column address decoder 18, a write driver 20, a sense amplifier 22, an address input buffer 24, address input registers 26 and 28, a multiplexer 30, a data input buffer 32, data input registers 34, 36, and 38, a data transmission control part 40, a data output buffer 42, switches S1, S2, S3, S4, S5, S6, and S7, a WE input buffer 44, WE input registers 46, 48, and 50, and a control signal generating part 52.

The m×n memory cells either transmit the data stored in each memory cell to the pertinent bit line pair (BL1, BL1B), (BL2, BL2B), ..., (BLm, BLmB) or store the data transmitted to the pertinent bit line pair in the corresponding memory cell. The precharging and equalizing circuits 12-1, 12-2, ..., 12-m precharge and equalize the pertinent bit line pair (BL1, BL1B), (BL2, BL2B), ..., (BLm, BLmB). The column selection switches 14-1, 14-2, ..., 14-m control the transmission of data between the pertinent bit line pair and the corresponding data line pair DLk, DLBk. The row address decoder 16 decodes the row address signal X and generates n number of word line selection signals WL1, WL2, ..., WLn. The column address decoder 18 decodes the column address signal Y and generates the control signals for controlling m number of column selection switches. The address input buffer 24 buffers and outputs the externally provided address XAi. The address input registers 26 and 28 respond to the control signal C0 and delay the address XAi by one and two cycles, respectively, outputting the signal WA1 and WA2, respectively. The control signal C0 is the signal resulting from the logical multiplication of a clock signal CLK and a write enable signal WE. The multiplexer 30 selects the read address RA buffered by the address input buffer 24 responsive to a read enable signal RE. During the execution of the write operation after 1 cycle, the multiplexer 30 outputs a write address WA1 responsive to a write enable signal WE. During the execution of the write operation after 2 cycles the multiplexer 30 selects and outputs a write address WA2 also responsive to the write enable signal WE. The data input buffer 32 buffers and outputs the externally provided data input signal XDj. The data input registers 34, 36, and 38 generates signals I1, I2, and I3, respectively, by delaying the data input signal XDj buffered by the data input buffer 32 by 0, 1, or 2 cycles, respectively, responsive to the data input control clock DINCLK. The data input control clock DINCLK is synchronized with the clock signal CLK 1 cycle after execution of the write command begins. The data input control clock DINCLK is also synchronized with the clock signal CLK 2 cycles after the execution of the write command begins. After executing write operation for 1 cycle, the data transmission control part 40, selects the I1 signal output from the data input register 34 responsive to a control signal C1 and selects the I2 signal output from the data input register 36 responsive to a control signal C2.

After executing the write operation for 2 cycles, the data transmission control part 40, selects the I1 signal output from the data input register 34 responsive to control signal C1, selects the I2 signal output from the data input register 36 responsive to the control signal C2, and selects the I3 signal output from the data input register 38 responsive to the control signal C3.

The data output buffer 42 generates the data amplified by the sense amplifier 22 as an output signal XD0y responsive to the signals KDATA and OE after 1 cycle of executing the write operation. The data output buffer generates a 1 cycle delayed version of the output signal XD0y responsive to the signal KDATA and OE after 2 cycles of executing the write operation. The WE input buffer 44 receives and buffers the write enable signal WE. The WE input registers 46, 48, and 50 delay by 0,1 and 2 cycles, respectively, the buffered write enable signal and output them as the signals W1, W2, and W3, respectively. The control signal generating part 52 receives the signals W1 and W2 during the execution of the write operation after 1 cycle and generates the control signals C1 and C2. The control signal generating part 52 also receives the signals W1, W2, and W3 during execution of the write operation after 2 cycles and generates the control signals C1, C2, C3. In other words, the WE input buffer 44, the WE input registers 46, 48, and 50 and the control signal generating part 52 generate the control signal C1 when the write, write command is continuously inputted during the execution of the write operation after 1 cycle and generate the control signal C2 when the read, write command is continuously inputted. In addition, the WE input buffer 44, WE input registers 46, 48, and 50, and the control signal generating part 52 generate the control signal C1 when the write, write, write command is continuously inputted during the execution of the write operation after 2 cycles. The WE input buffer 44, WE input registers 46, 48, and 50, and the control signal generating part 52 generate the control signal C2 when the read, write, write command or the write, read, write command is continuously inputted and generate the control signal C3 when the read, read, write command is continuously inputted. During the execution of the write command after 1 cycle, the switch S1 is turned on, and the switches S2, S3, S4, S5, S6, and S7 are turned off. During the execution of the write operation after 2 cycles, the switch S1 is turned off, and the switches S2, S3, S4, S5, S6, and S7 are turned on.

Figure 2:
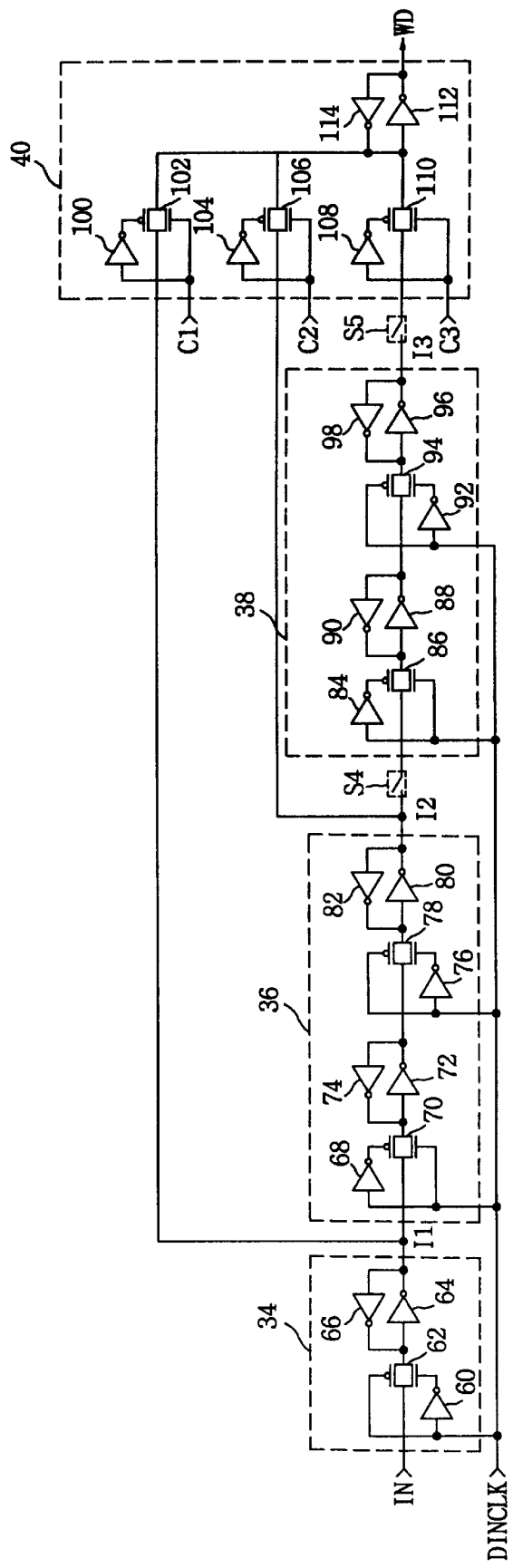
FIG. 2 is a circuit diagram of the data input register and the data transmission control part shown in FIG. 1.

FIG. 2 shows the circuit of the data transmission control part 40 and the data input registers 34, 36, and 38 shown in FIG. 1. The data input register 34 is comprised of the latch made of an inverter 60, a CMOS transmission gate 62, and inverters 64 and 66. The CMOS transmission gate 62 responds to a low data input control clock DINCLK and transmits an output signal IN of the data input buffer 32. The latch made of the inverters 64 and 66 latch and reverse the output signal of the CMOS transmission gate 62 and outputs a signal I1.

The data input register 36 comprises the latches respectively made of inverters 68 and 76, CMOS transmission gates 70 and 78, and inverters 72 and 74 and 80 and 82. The CMOS transmission gate 70 transmits the signal I1 responsive to a high data input control clock DINCLK. The latch made of the inverters 72 and 74 latches, inverts and outputs the output signal of the CMOS transmission gate 70. The CMOS transmission gate 78 transmits the output signal of the inverter 72 responsive to a low data input control clock DINCLK. The latch made of the inverters 80 and 82 latches, inverts, and outputs the output signal of the CMOS transmission gate 78.

The data input register 38 is comprised of the latches respectively made of inverters 84, 92, CMOS transmission gates 86 and 94 and inverters 88 and 90 and 96 and 98. The construction and function of the data input register 38 is the same as that of the data input register 36. In other words, the CMOS transmission gate 86 transmits a signal I2 responsive to a high data input control clock DINCLK. The latch made of the inverters 88 and 90 latches, inverts, and outputs the output signal of the CMOS transmission gate 86. The CMOS transmission gate 94 transmits an output signal of the inverter 88 responsive to a low data input control clock DINCLK. The latch made of the inverters 96 and 98 latches, inverts, and output as signal I3, an output signal of the CMOS transmission gate 94.

The data transmission control part 40 is comprised of the latch made of inverters 100, 104 and 108, CMOS transmission gates 102, 106, and 110 and inverters 112 and 114. The CMOS transmission gates 102, 106, and 110 respectively transmit the signals I1, I2, and I3 responsive to high control signals C1, C2, and C3, respectively. The latch made of the inverters 112 and 114 latches and inverts an output signal of the CMOS transmission gates 102, 106 and 110 and outputs it as the signal WD. The construction and function of the switches S4 and S5 are well known and will not be described in further detail.

Figure 3:
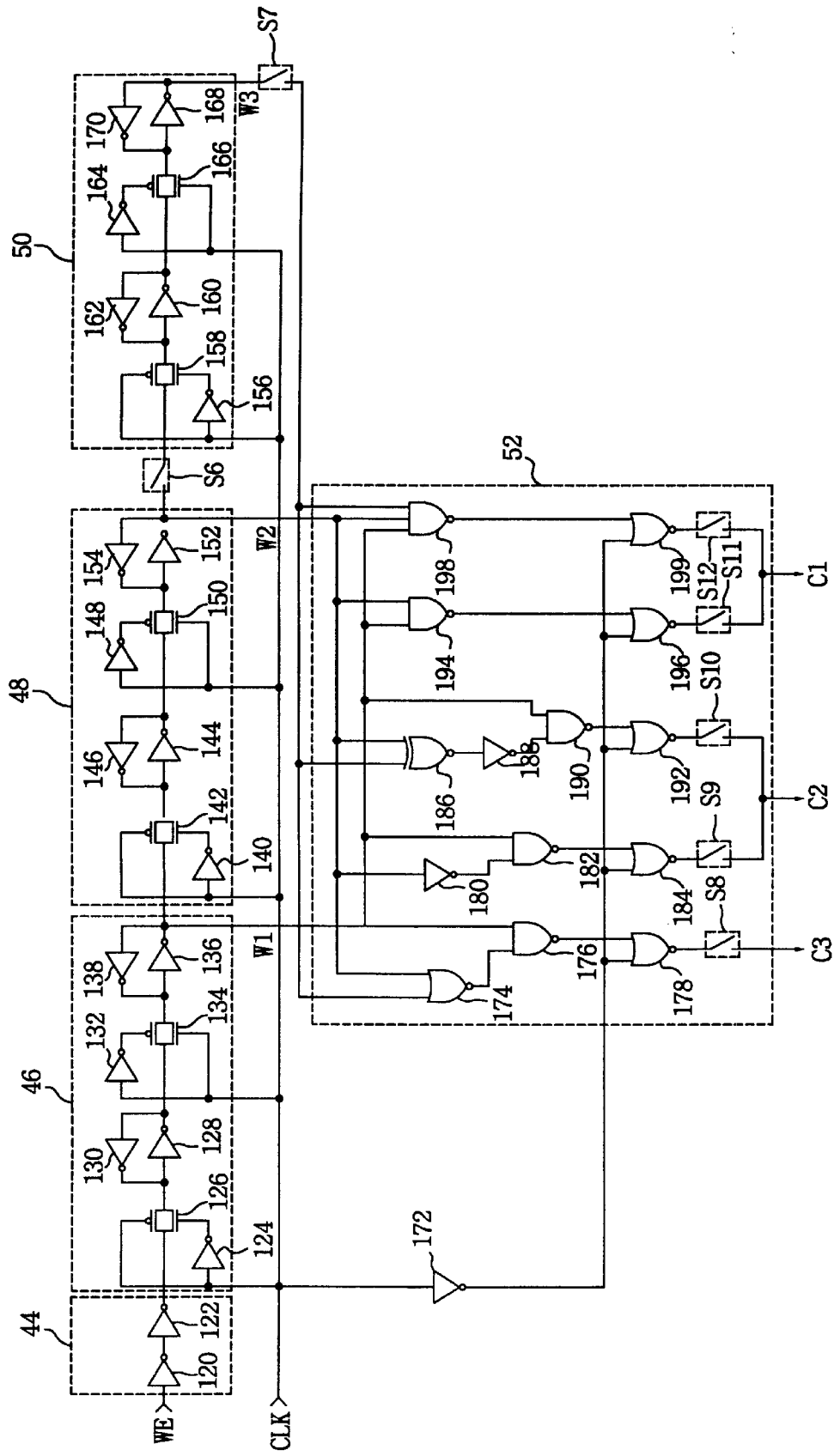
FIG. 3 is a circuit diagram of the data signal generating part shown in FIG. 1.

FIG. 3 shows the circuit of the control signal generating part 52 shown in FIG. 1. The write enable signal input buffer 44 is comprised of two serially connected inverters 120 and 122. The write enable signal input buffer 44 receives the write enable signal WE and buffers it.

The WE input register 46 is comprised of the latches respectively made of inverters 124 and 132, CMOS transmission gates 126 and 134, inverters 128 and 130 and 136 and 138. The CMOS transmission gate 126 transmits the buffered write enable signal WE responsive to a low clock signal CLK. The latch made of the inverters 128 and 130 latches, inverts and outputs the buffered write enable signal WE. The CMOS transmission gate 134 transmits an output signal of the inverter 128 responsive to a high clock signal CLK. The latch made of inverters 136 and 138 latches an output signal of the CMOS transmission gate 134, inverts it, and outputs it as the signal W1.

The WE input register 48 is comprised of the latches respectively made of inverters 140 and 148, CMOS transmission gates 142 and 150, and inverters 144, 146, 152, and 154. The construction and function of the WE input register 48 is the same as that of the WE input register 46. The circuit outputs an output signal of the inverter 152 as the signal W2.

The WE input register 50 is comprised of the latches respectively made of inverters 156 and 164, CMOS transmission gates 158 and 166, and inverters 160 and 162 and 168 and 170. The construction and function of the WE input register 50 is the same as that of the WE input registers 46 and 48 described above. The WE input register 50 outputs a W3 signal out of the inverter 168.

The control signal generating part 52 is comprised of NAND gates 176, 182, 190, 194, and 198, NOR gates 174, 178, 184, 192, 196, and 199, inverters 180 and 188, a XNOR gate 186 and switches S8, S9, S10, S11, S12.

During the execution of the write operation after 1 cycle, the switches S9 and S11 are turned on and the switches S6, S7, S8, S10, and S12 are turned off. In this case, the NAND gate 194 generates a low signal if the signals W1 and W2 are at highs. The NOR gate 196 responds to the clock signal inverted by the inverter 172, inverts an output signal of the NAND gate 194, and generates the control signal C1. In other words, NOR gate 196 inverts the output signal of the NAND gate 194 when the clock signal is at a high. The inverter 180 and the NAND gate 182 generate a low signal if a low signal W2 and a high signal W1 are inputted. The NOR gate 184 responds to the inverted clock signal output from inverter 172, inverts the output signal of the NAND gate 182, and generates the control signal C2.

During the execution of the write command after 2 cycles, the switches S6, S7, S8, S10, and S12 are turned on, and the switches S9 and S11 are turned off. In this case, the NAND gate 198 generates a low signal if high signals W1, W2, and W3 are inputted. The NOR gate 199 responds to the inverted clock signal output from inverter 172, inverts an output signal of the NAND gate 198 and outputs the control signal C1. The XNOR gate 186 and the inverter 188 generate a high signal if a high signal W2 and a low signal W3 are inputted or if a low signal W2 and a high signal W3 are inputted. The NAND gate 190 generates a low signal if a high signal W1 and a high signal is output from the inverter 188. The NOR gate 192 responds to the inverted clock signal output from inverter 172, inverts an output signal of the NAND gate 182, and generates the control signal C2. The NOR gate 174 generates a high signal if low signals W2, W3 are inputted. The NAND gate 176 generates a low signal if a high signal W1 and a high output signal of the NOR gate 174 are inputted. The NOR gate 178 responds to the inverted clock signal output from inverter 172, inverts an output signal of the NAND gate 176, and generates the control signal C3.

Figure 4:
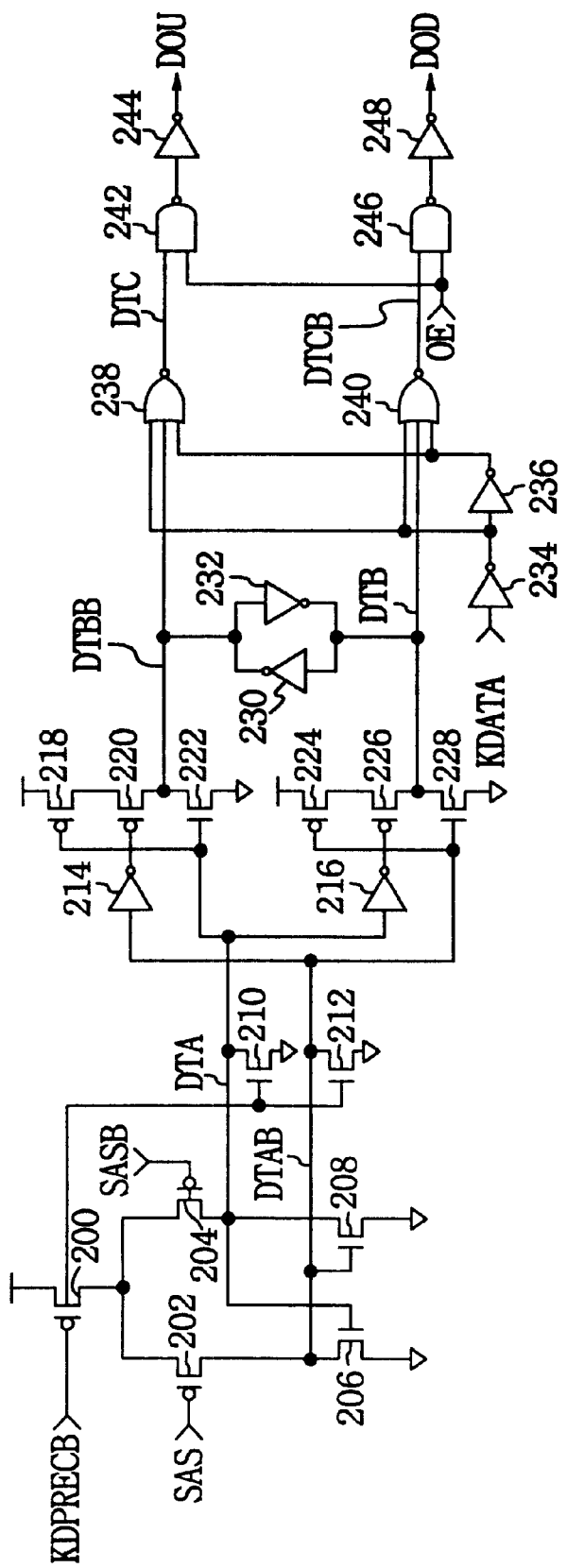
FIG. 4 is a circuit diagram of the data output buffer shown in FIG. 1.

FIG. 4 shows the circuit of the data output buffer 42 shown in FIG. 1. The data output buffer 42 is comprised of the latch made of PMOS transistors 200, 202, 204, 218, 220, 224, and 226, NMOS transistors 206, 208, 210, 212, 222, and 228, inverters 214, 216, 234, 236, 244, and 248, NOR gates 238 and 240, NAND gates 242 and 246, and inverters 230 and 232.

An enable circuit comprises the PMOS transistors 200, 202, and 204 and the NMOS transistors 206, 208, 210, and 212. During the execution of the write operation, the PMOS transistor 200 is turned off because an enable signal KDPRECB has a high level and the NMOS transistors 210 and 212 are turned on. Thus, the data line pair DTA and DTAB is at a low. Because the enable signal KDPRECB is at a low during the execution of the read operation, the PMOS transistors 200 is turned on and the NMOS transistors 210 and 212 are turned off. This results in amplifying the sense amplifier output signals SAS and SASB and transmitting them to the data line pair DTA and DTAB.

In the latch made of the inverters 214 and 216, the PMOS transistors 218, 220, 224, and 226, the NMOS transistors 222 and 228 and the inverters 230 and 232 during the execution of the write operation, the data of the data line pair DTA and DTAB is at a low level, and the PMOS transistors 220, 226 and the NMOS transistors 222 and 228 are turned off. The PMOS transistors 218 and 224 are turned on and the data latched in the latch 230 and 232 is maintained in the data line pair DTBB and DTB. During the execution of the read operation, the data transmitted to the data line pair DTA and DTAB is respectively inverted and transmitted as the data line pair DTB and DTBB.

The circuit made of the inverters 234 and 236 and the NOR gates 238 and 240 respectively invert the data transmitted to the data line pair DTBB and DTB by the signal synchronized with the clock signal CLK, and output it to the data line pair DTC and DTCB. In other words, the circuit respectively inverts the data transmitted to the data line pair DTBB and DTB and transmits it to the data line pair DTC and DTCB when the signal KDATA changes from a low to high. The signal KDATA is enabled to buffer and output a signal out of the sense amplifier 22 during the execution of the write operation after 1 cycle. The data output buffer 42 buffers and latches the output signal of the sense amplifier 22 during the execution of the write operation after 2 cycles and is enabled to delay the data latched by 1 cycle and output it. In other words, the signal KDATA is enabled in order to output the read data in the current cycle in case the execution of the write operation after 1 cycle. Conversely, the signal KDATA is enabled to output the read data in the next cycle in case of the execution of the write operation after 2 cycles. But the timing of the latch 230 and 232 is the same during the execution of the write operation after 1 cycle or 2 cycles. The only difference is in the timing of the output signal pair D0U and D0D by the signal KDATA.

The circuit comprised of the NAND gates 242 and 246 and the inverters 244 and 248 responds to the output enable signal OE, and respectively outputs the signals transmitted to the data line pair DTC and DTCB as the data output signal pair D0U and D0D. In other words, the read method during the execution of the write operation after 1 cycle uses a flow-through process responsive to the data latched in the data output buffer 42 and outputs it in the current cycle. During the execution of the read method after 2 cycles, the method uses a pipelined process responsive to the data latched in the data output buffer 42 and outputs it in the next cycle.

What follows is an explanation of the address and data processing method during the execution of the write operation after 1 or 2 cycles of the semiconductor memory device of the invention shown in FIG. 1. First, the write operation after 1 cycle can be classified into two cases. In the first case, the write, write command is continuously inputted and the write data inputted during the second write command is written in the cell. In the second case, the read, write command is continuously inputted and the write data corresponding to the last write command inputted before the continuous read, write command is written in the cell during the second write command.

Figure 5:
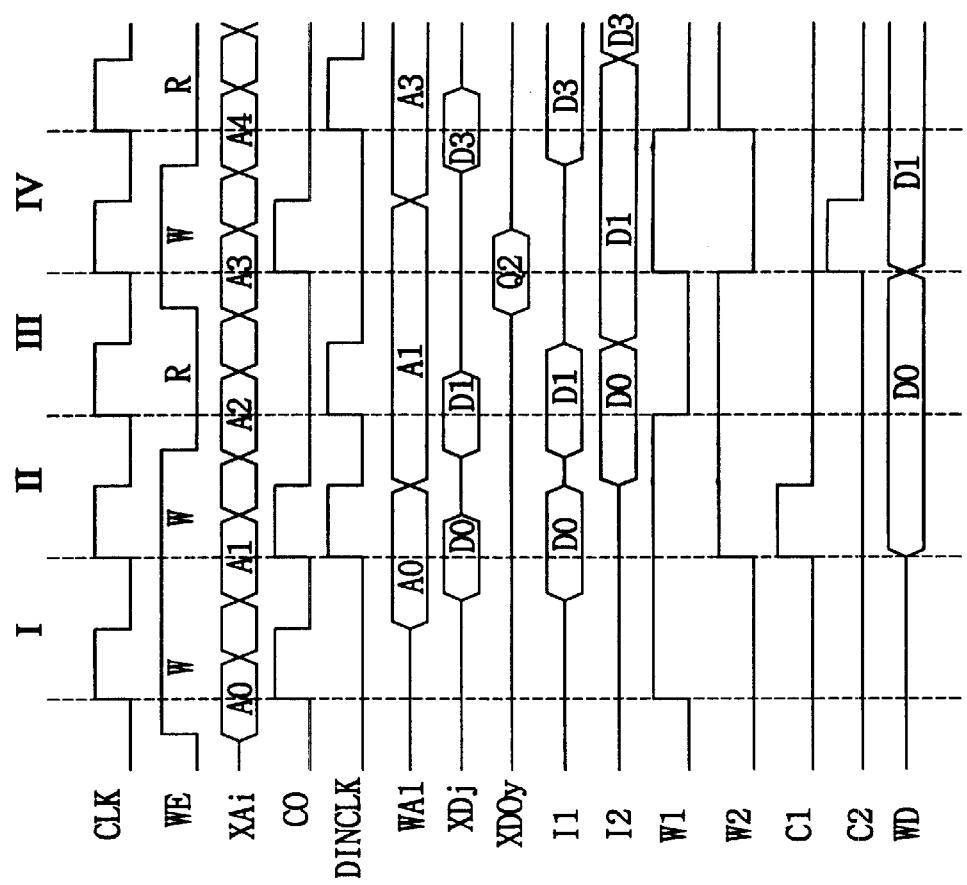
FIG. 5 is a timing diagram of the write operation after 1 cycle for the device shown in FIG.1.

FIG. 5 is a timing diagram of the write operation after 1 cycle of the device shown in FIG. 1 where the write data is inputted after 1 cycle of the write address input. At this time, the switch S1 is turned on, the switches S2, S3, S4, S5, S6, and S7 are turned off, the switches S8, S10, and S12 (FIG. 3) are turned off, and the switches S9 and S11 are turned on.

If the write command is inputted during the first cycle, the address input buffer 24 buffers an external address A0 and provides it to an address input register. The address input register 26 responds to a high control signal C0 and latches the address A0. The data input buffer 32 buffers the data D0 and outputs it. The data input register 34 outputs the data D0 responsive to a low data input control clock DINCLK. The WE input buffer 44 receives the write enable signal WE and buffers it. The WE input register 46 latches the WE signal responsive to the DINCLK signal and outputs the latched signal as W1.

If the write command is inputted during the second cycle, the address input buffer 24 buffers an external write address A1 and outputs it to the address input register 26. The address input register 26 outputs the address A0 as the signal WA1 responsive to a high control signal C0. The address input register 26 outputs the address A1 as the signal WA1 responsive to the low control signal C0. The data input register 34 outputs the data D0 as the signal I1 responsive to a high data input control clock DINCLK. The data input register 34 outputs the data D1 as the signal I1 responsive to a low control clock DINCLK. The data input buffer 32 responds to the low data input control clock DINCLK, buffers the data D1, and outputs it. The data input register 36 outputs the data D0 responsive to the low data input control clock DINCLK. The WE input buffer 44 buffers and outputs the WE signal. The WE input registers 46 and 48 output high W1 and W2 signals. The control signal generating part 52 generates the control signal C1 resulting from the logical multiplication of the signals W1 and W2 responsive to a high clock signal CLK. The data transmission control part 40 responds to the control signal C1, latches the data D0 outputted from the data input register 34, and provides it as the signal WD. Therefore, the write operation of the write data D0 pertinent to the address A0 is executed.

The first cycle I and the second cycle II in FIG. 5 are pertinent to the first case (write, write case). If the read command is inputted during the third cycle, the address input buffer 24 buffers an external read address A2 and outputs it to the multiplexer 30. The address input register 26 outputs the address A1 as the signal WA1 responsive to the low control signal C0. The data input register 34 transmits the data D1 as the signal I1 responsive to the high data input control clock DINCLK. The data input register 36 transmits the data D1 as the signal I2 responsive to the high data input control clock DINCLK. The data input register 36 transmits the data D1 as the signal I2 responsive to the low control clock DINCLK. The WE input registers 46 and 48 generate low and high signals respectively as the signals W1 and W2. The control signal generating part 52 does not generate the control signals C1 and C2 during this period. Therefore, the write operation is not executed. The data read operation by the flow through process is executed and the output data Q2 is generated as the output signal XD0y.

If the write command is inputted during the fourth cycle, the address input buffer 24 buffers the address A3 and outputs it. The address input register 26 outputs the address A1 as the address WA1 responsive to the high control signal C0. The address input register 26 outputs the address A3 as the address WA1 responsive to the low control signal C0. The data 20 input buffer 32 buffers the data D3 and outputs it. The data input register 34 outputs the data D3 responsive to the low data input control clock DINCLK. The data input register 36 outputs the data D1 responsive to the low data input control clock DINCLK. The WE input buffer 44 buffers the WE input and outputs it. The WE input registers 46 and 48 provide a high signal W1 and a low signal W2. The control signal generating part 52 generates the 25 control signal C2 responsive to a high clock signal. The data transmission control part 40 transmits the data D1 as the signal WD responsive to the control signal C2. Therefore, the read operation of the write data D1 pertinent to the address A1 is executed.

The third cycle III and the fourth cycle IV in FIG. 5 are pertinent to the second case (read, write case). As shown in the timing diagram of FIG. 5, the write data D0 is transmitted to the data line pair in the second write cycle the read data Q is transmitted from the cell to the data line pair in the third read cycle, and write data D1 is transmitted to the data line pair in the fourth write cycle. Therefore, the problem of the data collision in the data line pair does not occur.

The write operation after 2 cycles can be classified into the three cases described below. In the first case, the write, write, write command is continuously inputted, and the write data inputted during the input of the third write command is written in the cell. In the second case, the write, read, write command is continuously inputted, or the read, write, write command is continuously inputted. The write data corresponding to the last write command before the continuous write, read, write or read, write, write command is written in the cell responsive to the third write command. In the third case, the read, read, write command is inputted and the write data pertinent to the write command inputted first among the 2 numbers of write data inputted before this continuous command is written in the cell.

Figure 6:
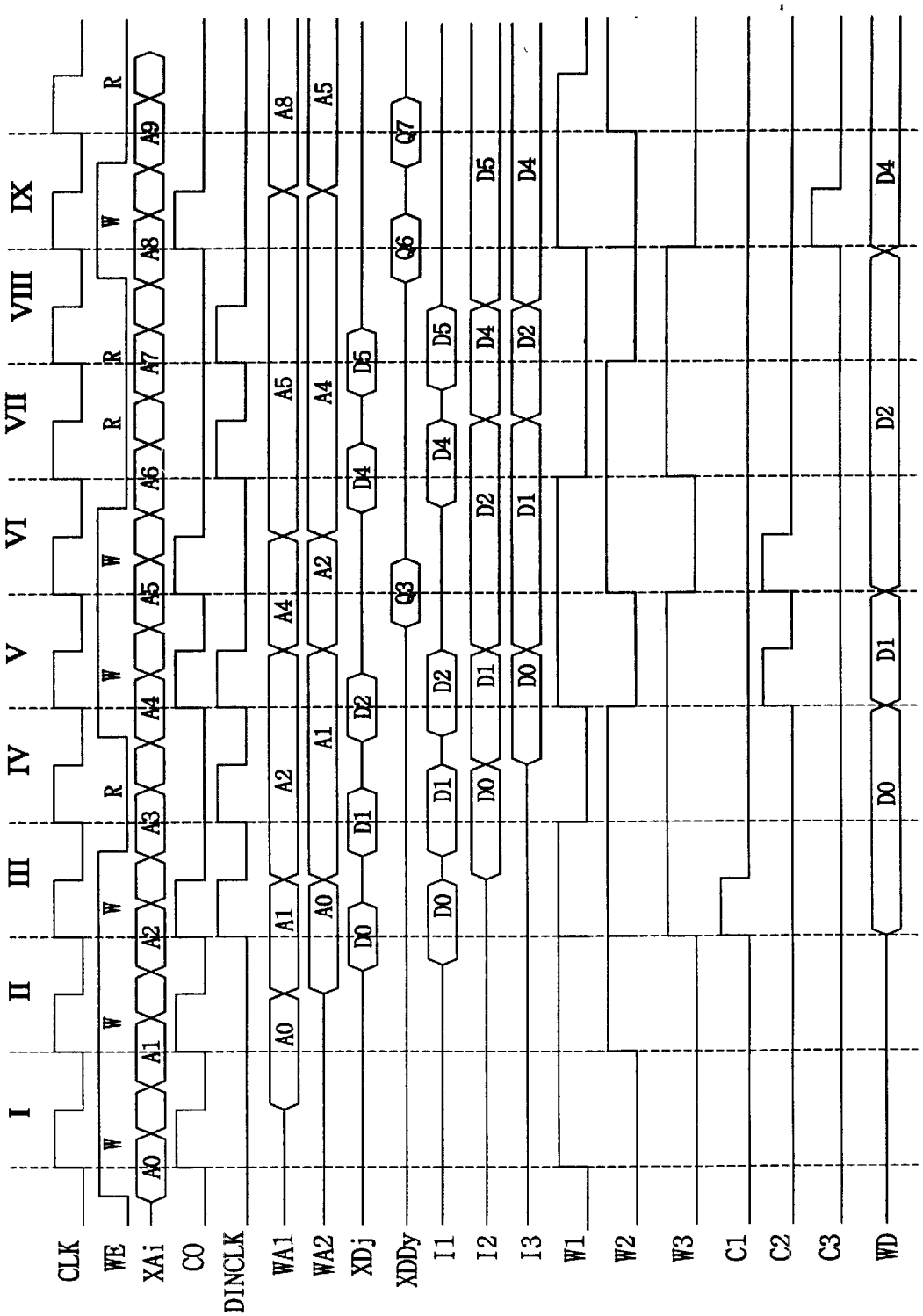
FIG. 6 is a timing diagram of the write operation after 2 cycles for the device shown in FIG. 1.

The first cycle I, the second cycle II and the third cycle III in FIG. 6 are pertinent to the first case. The third cycle III, the fourth cycle IV and the fifth cycle V in FIG. 6 are pertinent to the second case. The fourth cycle IV, the fifth cycle V and the sixth cycle VI in FIG. 6 are pertinent to the other second case. The seventh cycle, VII, the eighth cycle VIII 15 and the ninth cycle IX in FIG. 6 are pertinent to the third case described. FIG. 6 is a timing diagram of the write operation after 2 cycles for the device shown in FIG. 1. The write data is inputted within the 2 cycles of the input of the write address. In this case, the switch S1 (FIG. 1) is turned off, the switches S2, S3, S4, S5, S6, and S7 are turned on, the switches S8, S10, S12 (FIG. 3) are turned on, and the switches S9 and S11 are turned off.

If a write command is input during the first cycle, the address input buffer 24 buffers the address A0 and outputs it. The address input register 26 outputs the address A0 responsive to the low control signal C0. The WE input buffer 44 buffers and outputs the WE signal. The WE input registers 46, 48 and 50 output a high signal W1, a low signal W2, and a low signal W3.

If a write command is input during the second cycle, the address input buffer 24 buffers and outputs the address A1. The address input register 26 outputs the address A0 responsive to the high control signal C0. The address input register 26 outputs the address A1 responsive to the low control signal C0. The address input register 28 outputs the address A0 responsive to the low control signal C0. The data input buffer 32 buffers and outputs the data D0. The data input register 34 outputs the data D0 responsive to the low data input control clock DINCLK. The WE input buffer 44 buffers the WE signal and outputs it. The WE input registers 46, 48, and 50 respectively generate high W1 and W2 signals and a low W3 signal.

If a write command is input during the third cycle, the address input buffer 24 buffers and outputs the address A2.

The address input registers 26 and 28 output the address A1 and the address A0 respectively responsive to the high control signal C0. The address input registers 26 and 28 output the address A2 and the address A1, respectively, responsive to the low control signal C0. The data input register 34 outputs data D2 as the signal I1 responsive to the high data input control clock DINCLK. The data input register 34 outputs the data D1 as the signal I1 responsive to the high data input control clock DINCLK. The data input register 36 outputs the data D0 as the signal I2 responsive to the low data input control clock DINCLK. The WE input buffer 44 outputs high signals W1, W2, and W3. The control signal generating part 52 receives the signals W1, W2, and W3 and generates the control signal C1 responsive to the high clock signal CLK. The data transmission control part 40 outputs the data D0 as the signal WD responsive to the control signal C1. Thus, the write operation for the write data D0 corresponding to the address A0 is executed.

If a read command is input during the fourth cycle, the address input buffer 24 buffers the read address A3 and outputs it to the multiplexer 30. The address input registers 34 and 36 output the address A2, A1 as the signals WA1, WA2 respectively responsive to the low control signal C0. The data buffer 32 buffers and outputs the data D1. The data input registers 34 and 36 output the data D1, D0 respectively, responsive to the high data input control clock DINCLK. Additionally, the data input registers 34 and 36 output the data D2 and D1, respectively, responsive to the low data input control clock DINCLK. The data input register 38 outputs the data D0 responsive to the low data input control clock DINCLK. The WE input buffer 44 buffers the WE signal and outputs the buffered WE signal. The WE input registers 46, 48, and 50 output low, high, and high signals W1, W2, and W3, respectively. Since a read command is input, the control signal generating part 52 does not generate the control signals C1, C2, and C3. The data transmission control part 40 outputs the latched data D0. Then, the read operation of the read data pertinent to the address A3 is executed.

If a write command is input during the fifth cycle, the address input buffer receives the address A4 and buffers it. The address input registers 26 and 28 output the addresses A2 and A1, respectively, responsive to the high control signal C0. Conversely, the address input registers 26 and 28 output the addresses A4 and A2, respectively, to the low control signal C0. The data input buffer 32 buffers the data D2 and outputs the buffered data D2. The data input register 34 outputs the data D2 responsive to the high data input control clock DINCLK. The data input registers 36 and 38 output the data D1 and D0, respectively, responsive to the high data input control clock DINCLK. Conversely, the data input registers 36 and 38 generate the data D2 and D1, respectively, responsive to the low data input control clock DINCLK. The WE input buffer 44 buffers the WE signal. The WE input register 46 respectively outputs the high, low, and high signals W1, W2, and W3. The control signal generating part 52 receives the signals W1, W2, and W3, and generates the control signal C2 responsive to the high clock signal CLK. The data transmission control part 40 outputs the data D1 as the signal WD responsive to the control signal C2. Therefore, the write operation of the write data D1 corresponding to the address A0 is executed.

If a write command is input during the sixth cycle, the address input buffer 24 buffers and outputs the address A5. The address input registers 26 and 28 respectively output the addresses A4 and A2 responsive to the high control signal C0 to the low control signal C0. Conversely, the address input registers 26 and 28, respectively, output the addresses A5 and A4. The data input register 34 outputs the data D4 responsive to the low data input control clock DINCLK. The data input registers 36 and 38, respectively, output the data D2 and D1 responsive to the low data input control clock DINCLK. The WE input buffer 44 buffers and outputs the WE signal. The WE input registers 46, 48, and 50 respectively output high signals W1 and W2 and low signal W3. The control signal generating part 52 receives the signals W1, W2, and W3 outputs the data D2 as the signal WD responsive to the high clock signal CLK. Therefore, the write operation of the write data D2 corresponding to the address A2 is executed.

If a read command is input during the seventh cycle, the address input buffer 24 buffers the read address A6 and outputs it to the multiplexer 30. The address input registers 26 and 28 output the addresses A5 and A4 responsive to the low control signal C0. The data input buffer 32 buffers the data D4 and outputs it. The data input registers 34, 36, and 38 output the data D4, D2, and D1, respectively, responsive to the high data input control clock DINCLK. Conversely, the data input registers 34, 36, and 38 output the data D5, D4, and D2, respectively, responsive to the low data input control clock DINCLK. The WE input buffer 44 buffers the RE signal. The WE input registers 46, 48, and 50 output a low W1 signal and high signals W2 and W3, respectively. Since a read command was input, the control signal generating part 52 does not generate the control signals C1, C2, and C3. The data transmission control part 40 transmits the latched data D2 as the signal WD. Then, the read operation of the read data pertinent to the read address A6 is executed.

If a read command is input during the eighth cycle, the address input buffer 24 buffers the read address A7 and provides it to the multiplexer 30. The address input registers 26 and 28 output the addresses A5 and A4 responsive to the low control signal C0. The data input buffer 32 buffers and outputs the data D4. The data input registers 34, 36, and 38 output the data D5, D4, and D2, respectively, responsive to the high data input control clock DINCLK. The data input registers 36 and 38, respectively, output the data D5 and D4 responsive to the low data input control clock DINCLK. The WE input buffer 44 buffers the RE signal. The WE input registers 46, 48, and 50 output low signals W1 and W2 and a high signal W3, respectively. Since a read command is input, the control signal generating part 52 does not generate the control signals C1, C2, and C3. The data transmission control part 40 outputs the latched data D2 as the signal WD. Then, the read operation of the read command pertinent to the read address A7 is executed.

If a write command is input during the ninth cycle, the address input buffer 24 buffers the address A8 and outputs it. The address input registers 26 and 28 output the address A5 and A4, respectively responsive to the high control signal C0. Conversely, the address input registers 26 and 28 output the address A8 and A5, respectively, responsive to the low control signal. The data input registers 36 and 38 output the data D5 and D4, respectively, responsive to the low data input control clock DINCLK. The WE input buffer 44 buffers the WE signal. The WE input registers 46, 48, 50 output a high signal W1 and low signals W2 and W3, respectively. The control signal generating part 52 receives the signals W1, W2, and W3 and generates the control signal C3 responsive to the high clock signal CLK. The data transmission control part 40 outputs the data D4 as the signal WD responsive to the control signal C3. Therefore, the write operation of the write data D4 corresponding to the address A4 is executed.

As shown in the timing diagram of FIG. 6, the write data D0 is transmitted to the data line pair in the third write cycle, the read data Q3 is transmitted to the data line pair in the fourth read cycle, the write data D1 is transmitted to the data line pair in the fifth write cycle, the write data D2 is transmitted to the data line pair in the sixth write cycle, the read data Q6 is transmitted to the data line pair in the seventh read cycle, the read data Q7 is transmitted to the data line pair in the eighth read cycle, and the write data D4 is transmitted to the data line pair in the ninth write cycle. Therefore, the problem of data collision in data line pairs does not occur if the address and the data are controlled as described above.

The semiconductor memory device of the present invention was described with respect to the execution of the write operation after 1 or 2 cycles without a dead cycle. However, if a user wants to configure a dead cycle, he can configure a deselect cycle in the middle of the operation cycle. The deselect cycle operates substantially like a read cycle.

Having illustrated and described the principles of my invention in a preferred embodiment thereof, it should be readily apparent to those skilled in the art that the invention can be modified in arrangement and detail without departing from such principles. I claim all modifications coming within the scope and spirit of the accompanying claims.

What is claimed is:

1. A semiconductor memory device, comprising:
   address input control means for receiving an external write or read address and delaying the write address by 1 cycle when the memory device operates in a write after 1 cycle mode or by 2 cycles when the memory device operates in a write after 2 cycles mode;
   data input control means for receiving external write data and delaying the write data by a first predetermined number of cycles when the memory device operates in the write after 1 cycle mode, delaying the write data by a second predetermined number of cycles when the memory device operates in the write after 1 cycle mode, delaying the write data by a third predetermined number of cycles when the memory device operates in the write after 2 cycles mode, or delaying the write data by a fourth predetermined number of cycles when the memory device operates in the write after 2 cycles mode; and
   data transmission control means for transmitting the write data delayed by the first predetermined number of cycles responsive to a first predetermined command sequence, transmitting the write data delayed by the second predetermined number of cycles responsive to a second predetermined command sequence, transmitting the write data delayed by the third predetermined number of cycles responsive to a third command sequence, or transmitting the write data delayed by the fourth predetermined number of cycles responsive to a fourth command sequence;
   wherein the first predetermined number of cycles is 0, the second predetermined number of cycles is 1, and the third predetermined number of cycles is either 0, 1, or 2; and
   wherein the first command sequence is a write, write command sequence, the second command sequence is a read, write command sequence, the third command sequence is a write, write, write command sequence, and the fourth command sequence is a write, read, write or write, read, read command sequence.

2. The semiconductor memory device of claim 1 wherein the address input control means includes:

a first address input register for generating a first delayed write address by delaying the write address by 1 cycle responsive to a first control signal;
   a second address input register for generating a second delayed write address by delaying the delayed write address by 1 cycle responsive to the first control signal;
   a multiplexer for selecting the read address responsive to a read command, the first delayed write address in the write after 1 cycle mode, and the second delayed write address in the write after 2 cycles mode.

3. The semiconductor memory device of claim 1 wherein the first control signal is the logical multiplication of a clock signal and a write command.

4. The semiconductor memory device of claim 1 wherein the data input control means includes:
   a first data register for generating a first data signal by transmitting the write data responsive to a second control signal;
   a second data register for generating the second data signal by latching the first data signal responsive to the second control signal; and
   a third data register for generating a third data signal by latching the second data signal responsive to the second control signal;
   wherein the first and second data signals are provided as outputs in the write after 1 cycle mode and wherein the first, second, and third data signals are provided as outputs during the write after 2 cycles mode.

5. The semiconductor memory device of claim 4 wherein the first data register includes:
   a first transmission gate for transmitting the write data responsive to the second control signal; and
   a first latch for generating the first data signal by latching an output of the first transmission gate.

6. The semiconductor memory device of claim 4 wherein the second data register includes:
   a second transmission gate for transmitting the first data signal responsive to the second control signal;
   a second latch for latching the transmitted first data signal;
   a third transmission gate for transmitting the latched first data signal responsive to the second control signal; and
   a third latch for generating the second data signal by latching an output of the third transmission gate.

7. The semiconductor memory device of claim 4 wherein the third data register includes:
   a fourth transmission gate for transmitting the second data signal responsive to the second control signal;
   a fourth latch for latching the transmitted second data signal;
   a fifth transmission gate for transmitting the latched second data signal responsive to the second control signal; and
   a fifth latch for generating the third data signal by latching an output of the fifth transmission gate.

8. The semiconductor memory device of claim 4 wherein the data transmission control means includes:
   control signal generating means for generating a third control signal when a write, write command sequence is received in the write after 1 cycle mode or when a write, write, write command sequence is received in the write after 2 cycles mode, a fourth control signal when a read, write command sequence is received in the write after 1 cycle mode or when a write, read, write or a read, write, write command sequence is received in the write after 2 cycles mode, and a fifth control signal when a read, read, write command sequence is received in the write after 2 cycles mode; and write data transmission means for transmitting the first data signal responsive to the third control signal, the second data signal responsive to the fourth control signal, and the third data signal responsive to the fifth control signal.

9. The semiconductor memory device of claim 8 wherein the control signal generating means includes:

a first write register for generating a first write signal by latching the write command responsive to a first logic state of a clock signal and outputting the first write signal responsive to a second logic state of the clock signal;

a second write register for generating a second write signal by latching the first write signal responsive to the first logic state of the clock signal and outputting the second write signal responsive to the second logic state of the clock signal;

a third write register for generating a third write signal by latching the second write signal responsive to the first logic state of the clock signal and outputting the third write signal responsive to the second logic state of the clock signal;

third control signal generating means for generating the third control signal by logically manipulating the first and second write signals in the write after 1 cycle mode or by logically manipulating the first, second, and third write signals in the write after 2 cycles mode;

fourth control signal generating means for generating the fourth control signal by logically manipulating inverted versions of the first and second write signals in the write after 1 cycle mode or by logically manipulating the first, second, and third write signals in the write after 2 cycles mode; and fifth control signal generating means for generating the fifth control signal by logically manipulating the first, second, and third write signals in the write after 2 cycle mode.

10. The semiconductor memory device of claim 9 wherein the first write register includes:

a first transmission gate for transmitting the write command responsive to the first logic state of the clock signal;

a first latch for latching an output signal of the first transmission gate;

a second transmission gate for transmitting an output signal of the first latch responsive to the second logic state of the clock signal; and a second latch for latching an output signal of the second transmission gate.

11. The semiconductor memory device of claim 10 wherein the second write register includes:

a third transmission gate for transmitting the first write signal responsive to the first logic state of the clock signal;

a third latch for latching an output signal of the third transmission gate;

a fourth transmission gate for transmitting an output signal of the third latch responsive to the second logic state of the clock signal; and a fourth latch for latching an output signal of the fourth transmission gate.

12. The semiconductor memory device of claim 11 wherein the third write register includes:

a fifth transmission gate for transmitting the second write signal responsive to the first logic state of the clock signal;

a fifth latch for latching an output signal of the fifth transmission gate;

a sixth transmission gate for transmitting an output signal of the fifth latch responsive to the second logic state of the clock signal; and a sixth latch for latching an output signal of the sixth transmission gate.

13. The semiconductor memory device in accordance with claim 12, wherein the first control signal is the signal that multiplies a clock signal and a write enable signal.

14. The semiconductor memory device in accordance with claim 13, wherein the second control signal generates by being synchronized with the clock signal after 1 cycle of the write command during the execution of the write operation after 1 cycle and generates by being synchronized with the clock signal after 2 cycle of the write command during the execution of the write operation after 2 cycle.

15. The semiconductor memory device in accordance with claim 12, wherein the address input control means includes:

a first address input register for delaying and outputting an output signal of the address input buffer by 1 cycle by responding the first control signal;

a second address input register for delaying and outputting an output signal of the address input buffer by 2 cycle by responding a first control signal;

a first switch for outputting the ourput signal of the first address input register to the selecting means by turning on during the execution of the write operation after 1 cycle, for turning off during the execution of the write operation after 2 cycle;

a second switch for outputting the output signal of the first address input register to the second address input register by turning off during the execution of the write operation after 1 cycle and turing on during the execution of the write operation after 2 cycle; and a third switch for outputting the output signal of the second address input register to the selecting means during the execution of the write operation by turning off during the execution of the write operation after 1 cycle.

16. The semiconductor memory device in accordance with claim 12, wherein the data input control means includes:

a first data input register for transmitting the output data from the data input buffer as a first signal by responding a second control signal of the first state;

a second data input register for latching an output signal of the first data input register by responding a second control signal of a second state, for transmitting the latched data as a second signal by responding the second control signal of the first state;

a third data input register for latching an output signal of the second data input register by responding the second control signal of the second state, for outputting the latched data as a third signal by responding the second control signal of the first state;

a fourth switch for transmitting the second signal to the third data input register by turning off during the execution of the write operation after 1 cycle and turning on during the execution of the write operation after 2 cycle; and a fifth switch for transmitting the third signal to the data transmission control part by turning off during the execution of the write operation after 1 cycle and turning on during the execution of the write operation after 2 cycle.

17. The semiconductor memory device in accordance with claim 16, wherein the first data input register includes:

a first transmission gate for transmitting the output data of the data input buffer by responding the second control signal of the first state; and a first latch for latching and outputting an output data of the first transmission gate as the first signal.

18. The semiconductor memory device in accordance with claim 16, wherein the second data input register includes:

a second transmission gate for transmitting the first signal by responding the second control signal of the second state;

a second latch for latching the output data of the second transmission gate;

a third transmission gate for transmitting the output data of the second latch by responding the second control signal of the first state; and a third latch for latching and transmitting the output data of the third transmission gate as the second signal.

19. The semiconductor memory device in accordance with claim 16, wherein the third data input register includes:

a fourth transmission gate for transmitting the second signal by responding the second control signal of the second state;

a fourth latch for latching the output data of the fourth transmission gate;

a fifth transmission gate for transmitting the output data of the fourth latch by responding the second control signal of the first state; and a fifth latch for latching and transmitting the output data of the fifth transmission gate as the third signal.

20. The semiconductor memory device in accordance with claim 12, wherein the data transmission control means includes:

a sixth transmission gate for transmitting the first signal by responding the third control signal of the second state;

a seventh transmission gate for transmitting the second signal by responding the fourth control signal of the second state;

a eighth transmission gate for transmitting the third signal by responding the fifth control signal of the second state; and a sixth latch for latching and outputting the output data of the sixth, seventh and eighth transmission gate.

21. The semiconductor memory device in accordance with claim 12, wherein the control signal generating means includes:

a first write/read command input register for latching the write or read command by responding the clock signal of the first state, for outputting the latched data as the fourth signal by responding the clock signal of the second state;

a second write/read command input register for latching the fourth signal by responding the clock signal of the first state, for outputting the latched data as the fifth signal by responding the clock signal of the second state;

a third write/read command input register for latching the fifth signal by responding the clock signal of the second state, for outputting the latched data as the sixth signal by responding the clock signal of the second state;

third control signal generating means for generating the third control signal by logically multiplying the fourth signal and the fifth signal during the execution of the write operation after 1 cycle, for generating the third control signal by logically multiplying the fourth signal, the fifth signal and the sixth signal during the execution of the write operation after 2 cycle;

fourth control signal generating means for generating the fourth control signal by logically multiplying reversed signals of the fourth signal and the fifth signal during the execution of the write operation after 1 cycle, for generating the fourth control signal by logically multiplying non-logically added signals of the fourth signal, the fifth signal and the sixth signal during the execution of the write operation after 2 cycle; and fifth control signal generating means for generating the fifth control signal by logically multiplying exclusive logically added signals of the fourth signal, the fifth signal and the sixth signal during the execution of the write operation after 2 cycle.

22. The semiconductor memory device in accordance with claim 21, wherein the first write/read command input register includes:

a sixth transmission gate for transmitting the write or read command by responding the clock signal of the first state;

a sixth latch for latching the output data of the sixth transmission gate;

a seventh transmission gate for transmitting the write or read command by responding the clock signal of the second state; and a seventh latch for latching and outputting the output data of the seventh transmission gate.

23. The semiconductor memory device in accordance with claim 21, wherein the second write/read command input register includes:

an eighth transmission gate for transmitting the fourth signal by responding the clock signal of the first state;

an eighth latch for latching the output data of the eighth transmission gate;

a ninth transmission gate for transmitting the write or read command by responding the clock signal of the second state; and a ninth latch for latching and outputting the output data of the ninth transmission gate as the fifth signal.

24. The semiconductor memory device in accordance with claim 21, wherein the third write/read command input register includes:

a tenth transmission gate for transmitting the fifth signal by responding the clock signal of the first state;

an eighth latch for latching the output data of the tenth transmission gate;

an eleventh transmission gate for transmitting the write or read command by responding the clock signal of the second state; and an eleventh latch for latching and outputting the output data of the eleventh transmission gate as the sixth signal.

25. A data processing method for a semiconductor memory device comprising:

address input control means for outputting a read address from the outside, delaying an output of a write address by 1 cycle during the execution of a write operation after 1 cycle, and delaying an output of the write address by 2 cycles during the execution of the write command after 2 cycles;

data input control means for delaying by 0 cycle or 1 cycle an output of write data inputted from the outside after 1 cycle during the execution of the write operation after the 1 cycle, and delaying by 0 cycle, 1 cycle and 2 cycles the output of the write data inputted from the outside after 2 cycles during the execution of the write operation after 2 cycles;

wherein the data input control means reads the data from a cell pertinent to a read address from the address input control means, outputs the data through the flow through method during the execution of the write operation after the 1 cycle, outputs the data through the pipelined method during the execution of the write operation after the 2 cycles, and writes the data transmitted to the data transmission control means to a cell pertinent to a write address from the address input control means;

wherein the data delayed by 0 cycle is transmitted to the predetermined number of cells when write, write command is continuously inputted during the execution of the write operation after the 1 cycle, wherein the data delayed by 1 cycle is transmitted to the predetermined number of cells when read, write command is continuously inputted, wherein the data delayed by 0 cycle is transmitted to the predetermined number of cells when write, write, write command is continuously inputted during the execution of the write command after the 2 cycles, wherein the data delayed 1 cycle is transmitted to the predetermined number of cells when write, read, write command is continuously inputted or when read, write, write command is continuously inputted, and wherein the data delayed by 2 cycle is transmitted to the predetermined number of cells when read, read, write command is continuously inputted.

26. A method for processing data in a semiconductor memory device, comprising:

receiving an external write or read address;

if the read address is received, reading data from a cell corresponding to the read address;

if the write address is received, delaying the write address by 1 cycle when the memory device operates in a write after 1 cycle mode or by 2 cycles when the memory device operates in a write after 2 cycles mode;

receiving external write data;

delaying the write data by a first or second predetermined number of cycles when the memory device operates in the write after 1 cycle mode or by a third or fourth predetermined number of cycles when the memory device operates in the write after 2 cycles mode;

transmitting the write data delayed by the first predetermined number of cycles responsive to a first command sequence;

transmitting the write data delayed by the second predetermined number of cycles responsive to a second command sequence;

transmitting the write data delayed by the third predetermined number of cycles responsive to a third command sequence;

transmitting the write data delayed by the fourth predetermined number of cycles responsive to a fourth command sequence; and writing the write data to a cell corresponding to the write address;

wherein the first predetermined number of cycles is 0, the second predetermined number of cycles is 1, the third predetermined number of cycles is 0, and the fourth predetermined number of cycles is either 1, or 2; and wherein the first command sequence is a write, write command sequence, the second command sequence is a read, write command sequence, the third command sequence is a write, write, write command sequence, and the fourth command sequence is a write, read, write or write, read, read command sequence.

27. The method of claim 26 wherein delaying the write address includes:

generating a first delayed write address by delaying the write address by 1 cycle responsive to a first control signal;

generating a second delayed write address by delaying the delayed write address by 1 cycle responsive to the first control signal; and selecting the read address responsive to a read command, the first delayed write address in the write after 1 cycle mode, and the second delayed write address in the write after 2 cycles mode.

28. The method of claim 27 wherein the first control signal is the logical multiplication of a clock signal and a write command.

29. The method of claim 27 wherein delaying the write data includes:

generating a first data signal by transmitting the write data responsive to a second control signal;

generating the second data signal by latching the first data signal responsive to the second control signal; and generating a third data signal by latching the second data signal responsive to the second control signal;

wherein the first and second data signals are provided as outputs in the write after 1 cycle mode and wherein the first, second, and third data signals are provided as outputs during the write after 2 cycles mode.

30. The method of claim 29 wherein transmitting the delayed write data includes:

generating a third control signal when a write, write command sequence is received in the write after 1 cycle mode or when a write, write, write command sequence is received in the write after 2 cycles mode, a fourth control signal when a read, write command sequence is received in the write after 1 cycle mode or when a write, read, write or a read, write, write command sequence is received in the write after 2 cycles mode, and a fifth control signal when a read, read, write command sequence is received in the write after 2 cycles mode; and transmitting the first data signal responsive to the third control signal, the second data signal responsive to the fourth control signal, and the third data signal responsive to the fifth control signal.

31. The semiconductor memory device of claim 30 wherein generating the third control signal includes:

generating a first write signal by latching the write command responsive to a first logic state of a clock signal and outputting the first write signal responsive to a second logic state of the clock signal;

generating a second write signal by latching the first write signal responsive to the first logic state of the clock signal and outputting the second write signal responsive to the second logic state of the clock signal;

generating a third write signal by latching the second write signal responsive to the first logic state of the clock signal and outputting the third write signal responsive to the second logic state of the clock signal;

generating the third control signal by logically manipulating the first and second write signals in the write after 1 cycle mode or by logically manipulating the first, second, and third write signals in the write after 2 cycles mode;

generating the fourth control signal by logically manipulating inverted versions of the first and second write signals in the write after 1 cycle mode or by logically manipulating the first, second, and third write signals in the write after 2 cycles mode; and generating the fifth control signal by logically manipulating the first, second, and third write signals in the write after 2 cycle mode.

* * * * *

UNITED STATES PATENT AND TRADEMARK OFFICE
CERTIFICATE OF CORRECTION

PATENT NO.    : 6,549,994 B1
DATED         : April 15, 2003
INVENTOR(S)   : Noh

It is certified that error appears in the above-identified patent and that said Letters Patent is hereby corrected as shown below:

Column 7,
Line 64, "the data 20 input buffer" should read -- the data input buffer --.

Column 8,
Line 4, "generates the 25 control" should read -- generates the control --.
Line 37, "VIII 15 and" should read -- VIII and --.

Column 14,
Line 33, "for outputting the ourput signal" should read
-- for outputting the output signal --.

Signed and Sealed this

Sixteenth Day of December, 2003

JAMES E. ROGAN
*Director of the United States Patent and Trademark Office*